US009459356B2

United States Patent
Lee et al.

(10) Patent No.: US 9,459,356 B2
(45) Date of Patent: *Oct. 4, 2016

(54) COMPOSITION FOR RADIATION IMAGING DETECTOR AND A RADIATION IMAGING DETECTOR COMPRISING THE SAME

(75) Inventors: Denny Lap Yen Lee, West Chester, PA (US); Hyun Suk Jang, Seongnam-si (KR)

(73) Assignee: VIEWORKS CO., LTD., Gyeonggi-Do (KR)

( * ) Notice: Subject to any disclaimer, the term of this patent is extended or adjusted under 35 U.S.C. 154(b) by 909 days.

This patent is subject to a terminal disclaimer.

(21) Appl. No.: 13/565,415

(22) Filed: Aug. 2, 2012

(65) Prior Publication Data

US 2013/0032720 A1   Feb. 7, 2013

Related U.S. Application Data

(60) Provisional application No. 61/514,089, filed on Aug. 2, 2011, provisional application No. 61/514,116, filed on Aug. 2, 2011, provisional application No. 61/514,121, filed on Aug. 2, 2011.

(51) Int. Cl.
*G01T 1/20* (2006.01)
*C09K 11/61* (2006.01)
*C09K 11/62* (2006.01)
(Continued)

(52) U.S. Cl.
CPC .............. *G01T 1/20* (2013.01); *C09K 11/616* (2013.01); *C09K 11/628* (2013.01); *C09K 11/682* (2013.01); *C09K 11/7701* (2013.01); *C09K 11/7774* (2013.01); *G01T 1/24* (2013.01); *G21K 4/00* (2013.01); *H01L 27/14676* (2013.01);
(Continued)

(58) Field of Classification Search
CPC ....... G01T 1/2018; G01T 1/202; G01T 1/24; G01T 1/20; G01T 1/2023; G21K 4/00; G03G 5/069; G03G 5/047; G03G 2215/00957; H01L 27/14676
USPC .......... 250/361 R, 370.11, 370.09, 366, 367, 250/362, 370.01, 483.1, 458; 288/159; 252/301.17

See application file for complete search history.

(56) References Cited

U.S. PATENT DOCUMENTS 4,620,939 A * 11/1986 Maeda et al. ............ 252/301.17
5,294,509 A    3/1994 Ashiya et al.
(Continued)

FOREIGN PATENT DOCUMENTS

CN    101919023 A    12/2010
EP    2317557 A2     5/2011
(Continued)

OTHER PUBLICATIONS

Office Action dated May 23, 2014 in Taiwanese Application No. 101127717.
(Continued)

*Primary Examiner* — David Porta
*Assistant Examiner* — Blake Riddick
(74) *Attorney, Agent, or Firm* — Saliwanchik, Lloyd & Eisenschenk

(57) ABSTRACT

Disclosed is a novel composition for radiation image detector. The composition comprises an organic matrix comprising a charge transport material (CTM); and scintillating particles for absorbing radiation, being dispersed in the organic matrix, wherein the scintillating particles are in contact with a charge generation material (CGM).

22 Claims, 4 Drawing Sheets

(51) Int. Cl.
  *C09K 11/77* (2006.01)
  *G21K 4/00* (2006.01)
  *H01L 27/146* (2006.01)
  *C09K 11/68* (2006.01)
  *G01T 1/24* (2006.01)

(52) U.S. Cl.
  CPC ....... *G21K 2004/06* (2013.01); *G21K 2004/08* (2013.01); *H01L 27/14665* (2013.01)

(56) References Cited

U.S. PATENT DOCUMENTS

| | | | |
|---|---|---|---|
| 5,422,209 A | 6/1995 | Ono et al. | |
| 5,462,825 A | 10/1995 | Tanaka et al. | |
| 5,512,753 A * | 4/1996 | Thomson et al. | 250/361 R |
| 5,942,615 A * | 8/1999 | Kobayashi et al. | 544/38 |
| 6,078,643 A * | 6/2000 | Vogelsong et al. | 378/98.2 |
| 7,196,333 B1 * | 3/2007 | Gerstenmayer et al. | 250/370.1 |
| 8,759,781 B2 * | 6/2014 | Lee et al. | 250/369 |
| 2002/0014591 A1 * | 2/2002 | Ghelmansarai | 250/366 |
| 2002/0079458 A1 | 6/2002 | Zur | |
| 2003/0025084 A1 | 2/2003 | Honda et al. | |
| 2006/0054863 A1 * | 3/2006 | Dai | B82Y 10/00 252/301.4 R |
| 2007/0069141 A1 * | 3/2007 | Nittoh et al. | 250/367 |
| 2008/0138724 A1 * | 6/2008 | Belknap et al. | 430/48 |
| 2008/0237470 A1 * | 10/2008 | Loureiro et al. | 250/361 R |
| 2009/0029276 A1 * | 1/2009 | Coggan et al. | 430/58.05 |
| 2009/0179155 A1 * | 7/2009 | Weinberg | 250/370.01 |
| 2010/0183330 A1 * | 7/2010 | Wada et al. | 399/116 |
| 2011/0038650 A1 * | 2/2011 | Kaneko et al. | 399/159 |
| 2011/0192981 A1 * | 8/2011 | Menge et al. | 250/362 |
| 2011/0206411 A1 * | 8/2011 | Mizushima et al. | 399/111 |
| 2011/0291014 A1 * | 12/2011 | Kusner | 250/362 |

FOREIGN PATENT DOCUMENTS

| | | |
|---|---|---|
| JP | 2006208158 A | 8/2006 |
| JP | 2007012982 A | 1/2007 |
| TW | 2011-15175 A | 5/2011 |
| TW | 2011-18968 A | 6/2011 |
| WO | WO-2008/118523 A2 | 10/2008 |

OTHER PUBLICATIONS

European Search Report in European Application No. 12819729.0, dated Mar. 13, 2015.

* cited by examiner

COMPOSITION FOR RADIATION IMAGING DETECTOR AND A RADIATION IMAGING DETECTOR COMPRISING THE SAME

CROSS-REFERENCE TO RELATED APPLICATIONS

This application claims the benefit of U.S. Provisional Patent Application Nos. 61/514,089, filed Aug. 2, 2011, 61/514,116, filed Aug. 2, 2011, and 61/514,121, filed Aug. 2, 2011, which are hereby incorporated by reference in their entirety.

FIELD OF THE INVENTION

The present invention relates to a novel composition for a radiation imaging detector and the radiation imaging detector comprising the same.

BACKGROUND

In the digital imaging of x-ray radiation, indirect conversion method that first converts the spatially distributed x-ray energy to light and then capture the light image using two dimensional photo sensors has at least the disadvantage of light scattering before reaching the photo sensors and therefore resulted with the loss of image sharpness. In the case of direct conversion using photo semiconductor material such as amorphous selenium has a significantly higher resolution as a result of no intermediate light conversion and therefore, scattered light does not arise. However, at present, the production of these photoconductive materials is complex and cost-intensive. Furthermore, the x-ray absorption coefficient for this currently commercially successful material, amorphous selenium, is relatively low for x-ray energy above 40 kev. For medical imaging above this energy, thick layer of selenium will be required and again increasing the complexity and cost of production. In recent years, many organic photoconductor (OPC) materials have been developed and successfully utilized in optical copiers and printers. However, since OPC molecules are mostly composed of lower atomic number elements such as carbon, oxygen, nitrogen, hydrogen, and maybe a small percentage of other higher atomic number elements, the x-ray absorption coefficient of these materials are in general, very low and therefore not suitable for x-ray imaging.

An x-ray direct conversion material that has good x-ray absorption coefficient together with the ability of generating electrical charges proportional to the x-ray energy is therefore highly desirable.

BRIEF SUMMARY

An embodiment is directed a novel composition for a radiation imaging detector and the imaging detector comprising the same. The composition for a radiation imaging detector comprising: an organic matrix comprising a charge transport material (CTM); and scintillating particles for absorbing radiation, being dispersed in the organic matrix, wherein the scintillating particles are in contact with a charge generation material (CGM).

The charge generation material (CGM) in contact with the scintillating particles may be present in the form of a mixture with the charge transport material (CTM) in the organic matrix.

The scintillating particles may be coated with the charge generation material (CUM) in part or in whole surface.

The thickness of the charge generation material coated onto the scintillating particles may be sufficient to absorb more than about 20% of the scintillating light emitted from the scintillating particles.

The scintillating particles may include, but are not limited to, Gadolinium Oxysulfide (GOS), Cesium Iodide (CsI), Sodium Iodide (NaI), bismuth germanate (BGO), Zinc Sulfide (ZnS), Cadmium tungstate ($CdWO_4$ or CWO), LYSO ($Lu_{1.8}Y_{0.2}SiO_5(Ce)$) and the like and combinations thereof.

The scintillating particles may be doped with dopant including Europium (Eu), Terbium (Tb), Praseodymium (Pr) and Lithium (Li) and the like and combinations thereof.

The emission spectrum of the doped scintillating particles may be in the range of the absorption spectrum of the CGM material.

The size of the scintillating particles may be smaller than pixel size of the radiation imaging detector.

The charge generation material may include, but are not limited to, quinolines, porphyrins, quinacridones, dibromo anthanthrone pigments, squalilium dyes, perylene diamines, perinone diamines, polynuclear aromatic quinones, pyrylium salts, thiopyrylium salts, azo pigments, triphenylmethane type dyes, selenium, oxyvanadium phthalocyanine, chloroaluminum phthalocyanine, copper phthalocyanine, oxytitanium phthalocyanine, chlorogallium phthalocyanine, hydroxygallium phthalocyanine, magnesium phthalocyanine, metal-free phthalocyanine, indigo type pigments. These charge generation material may be used alone or in a combination of two or more kinds thereof.

The charge transport material may include, but are not limited to, 4,4'-TPD (Triphenylamine Dimer), 9-Dicyanomethylene-2,4,7-trinitrofluorene, N,N'-Di(naphthalene-1-yl)-N,N'-di(4-methyl-phenyl)-benzidine, N,N'-Di(naphthalene-2-yl)-N,N'-di(3-methyl-phenyl)-benzidine, 4,4'-(1,2-Ethanediylidene)-bis(2,6-dimethyl-2,5-cyclohexadien-1-one), 2-(1,1-Dimethylethyl)-4-[3-(1,1-dimethylethyl)-5-methyl-4-oxo-2,5-cyclohexa-dien-1-ylidene]-6-methyl-2,5-cyclohexadien-1-one, N,N'-Di(naphthalen-1-yl)-N,N'-di(3-methyl-phenyl)-benzidine, Poly(3-octylthiophene-2,5-diyl), Poly(3-decylthiophene-2,5-diyl), N-Biphenylyl-N-phenyl-N-(3-methylphenyl)-amine, 4-N,N-Bis(4-methylphenyl)-amino-benzaldehyde-N,N-diphenylhydrazone, p-Diphenylaminobenzaldehyde-N-phenyl-methyl-hydrazone, N,N'-diphenyl-N,N'-bis(3-hydroxyphenyl)-1,1'-biphenyl-4,4'-diamine, N,N'-diphenyl-N,N'-bis(3-methylphenyl)-1,1'-biphenyl-4,4'-diamine, N,N,N',N'-tetra(4-methylphenyl)-(1,1'-biphenyl)-4,4'-diamine, 4,4'-(3,4-dimethylphenylazanediyl)bis(4,1-phenylene)dimethanol, N,N'-bis(3-methylphenyl)-N,N'-bis(4-n-butylphenyl)-1,1'-terphenyl-4,4-diamine. These charge transport material may be used alone or in a combination of two or more kinds thereof.

The weight ratio of CGM to CTM may be about 1:99 to about 95:5.

The average diameter of the scintillating particles may be in the range of about 1 to about 100 μm.

The volume percentage of the scintillating particles in the organic matrix may be about 10 vol % to about 95 vol %.

The radiation may be at least one selected from said group consisting of X-ray, gamma-ray, and ionization radiation.

The composition may be in the form of a layer having a thickness of about 5 μm to about 2000 μm.

The scintillating particles may be dispersed in the layer of the organic matrix.

The layer may be deposited on top of an image charge collection device.

Another embodiment is directed to a radiation imaging detector comprising the foregoing composition.

The composition may be charged with electrostatic charges.

The electrostatic charges may be discharged by radiation selected from group consisting of X-ray, gamma-ray, and ionization radiation.

The electrostatic charges may be recorded to form a radiation image.

Another embodiment is directed to a method for preparing a composition for radiation image detector. In an embodiment, the method comprises coating a charge generation material (CGM) onto a surface of scintillating particles; and dispersing the scintillating particles coated with the charge generation material into a organic matrix comprising a charge transport material (CTM).

In another embodiment, the method comprises mixing a charge generation material (CGM) and a charge transport material (CTM) to prepare a organic matrix; and dispersing scintillating particles into the organic matrix.

BRIEF DESCRIPTION OF THE DRAWINGS

The above and other features of the present disclosure will become apparent from the detailed description of the following embodiments in conjunction with the accompanying drawings.

DETAILED DESCRIPTION

Figure 1:
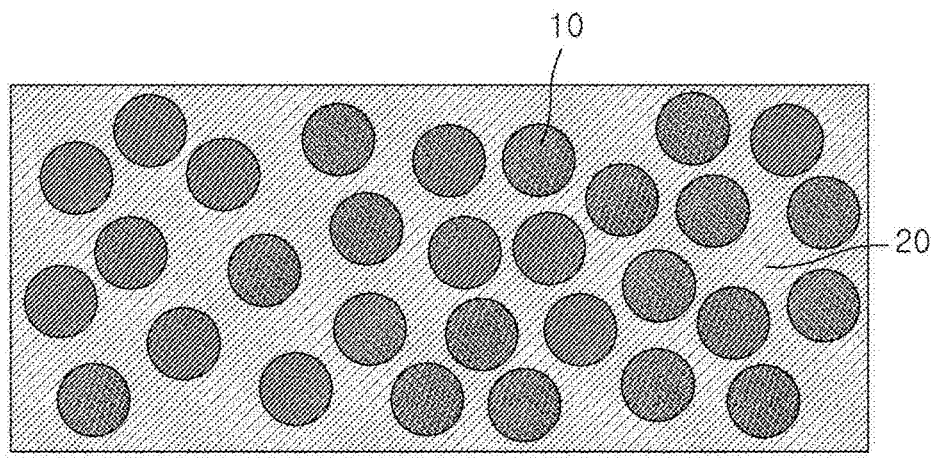
FIG. 1 is a schematic view illustrating a composition according to an exemplary embodiment.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A description of details apparent to those skilled in the art will be omitted herein for clarity.

An embodiment is directed to a composition for a radiation imaging detector. The composition comprises scintillating particles for absorbing radiation; and an organic matrix comprising a charge transport material (CTM). The scintillating particles are dispersed in the organic matrix.

The scintillating particles are in contact with a charge generation material (CGM). For example, the scintillating particles may be coated with the charge generation material (CGM) in part or in whole surface.

The term "contact" as used herein means to make a state in which the scintillating particles and the charge generation material (CGM) are in close contact with each other. In one embodiment, the whole surface of the scintillating particles may be surrounded by the charge generation material (CGM). In another embodiment, the scintillating particles may be coated with the charge generation material (CUM) in part. In another embodiment, the scintillating particles may be in contact with the charge generation material (CGM) being present in the form of a mixture with the charge transport material (CTM) in the organic matrix.

The scintillating particles may be dispersed in a continuous phase of the organic matrix.

FIG. 1 is a schematic view illustrating a composition according to an exemplary embodiment. As shown in FIG. 1, the scintillating particles 10 may be dispersed in the organic matrix 20.

Figure 2:
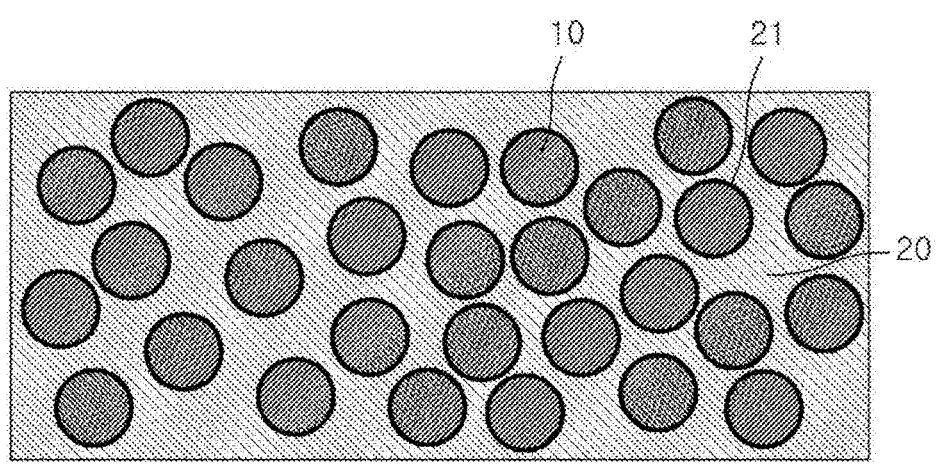
FIG. 2 is a schematic view illustrating a composition according to another exemplary embodiment.

FIG. 2 is a schematic view illustrating a layer for a radiation converter according to another exemplary embodiment. As shown in FIG. 2, the scintillating particles 10 may be coated with a charge generation material (CGM) 21 and the coated scintillating particles may be dispersed in the organic matrix 20.

The scintillating particles absorb radiation and generate a light pulse with intensity proportional to the absorbed energy. The scintillating particles having high atomic number will be more suitable for effectively absorbing radiation of higher energy.

The scintillating particles may include, but are not limited to, Gadolinium Oxysulfide (GOS), Cesium Iodide (CsI), Sodium Iodide (NaI), bismuth germanate (BGO), Zinc Sulfide (ZnS), Cadmium tungstate (CdWO$_4$ or CWO), LYSO (Lu$_{1.8}$Y$_{0.2}$SiO$_5$(Ce)). These scintillating particles may be used alone or in a combination of two or more kinds thereof. Among them, Gadolinium Oxysulfide (GOS) is preferred.

The size of the scintillating particles may be smaller than pixel size of the radiation imaging detector. For examples, the average diameter of the scintillating particles may be in the range of about 1 to about 100 µm, e.g., about 3 to about 50 p.m. Within the range, the composition may provide the radiation image detector with good resolution and low noise.

In an implementation, the scintillating particles may be doped with dopants. The dopants may include, but are not limited to, Europium (Eu), Terbium (Tb), Praseodymium (Pr) and Lithium (Li). These dopants may be used alone or in a combination of two or more kinds thereof. The scintillation spectrum of each scintillating particles can be different with different doping and proper type can be chosen to match the absorption spectrum of the charge generation material. For example, the emission spectrum of the doped scintillating particles may be in the range of the absorption spectrum of the charge generation material (CGM). In an implementation, when the scintillating particles are Gadolinium Oxysulfide (GOS) and the charge generation material (CGM) is phthalocyanine based compound, the dopant may be chosen from Eu, because the emission spectrum of the Eu doped scintillator matches the absorption spectrum of the phthalocyanine based charge generation material (CGM).

When the charge generation material is coated onto the scintillating particles, the thickness of the charge generation material coated onto the scintillating particles may be sufficient to absorb more than about 20%, preferably 30% or more of the scintillating light emitted from the scintillating particles.

The charge generation material may include, but are not limited to, quinolines, porphyrins, quinacridones, dibromo anthanthrone pigments, squalilium dyes, perylene diamines, perinone diamines, polynuclear aromatic quinones, pyrylium salts, thiopyrylium salts, azo pigments, triphenylmethane type dyes, selenium, oxyvanadium phthalocyanine, chloroaluminum phthalocyanine, copper phthalocyanine, oxytitanium phthalocyanine, chlorogallium phthalocyanine, hydroxygallium phthalocyanine, magnesium phthalocyanine, metal-free phthalocyanine, indigo type pigments. These charge generation material may be used alone or in a combination of two or more kinds thereof. For example, 2,9-Dibenzyl-anthra[2,1,9-def:6,5,10-d'e'f'] diisoquinoline-1,3,8,10-tetrone, Phthalocyanine Iron (II) complex, 8,9,18,19-Tetrachloro-bisbenzimidazo(2,1-a:1',2'-b')anthra(2,1,9-def:6,5,10, d'e'f')diisoquinoline-6,16-dione (mixture w/cis-isomer), 5,10,15,20-Tetraphenylporphine Vanadyl (IV) oxide, 2,9-Di(tridec-7-yl)-anthra[2,1,9-def:6,5,10-d'e'f']diisoquinoline-1,3,8,10-tetrone, 2,9-Di(pent-3-yl)anthra[2,1,9-def:6,5,10-d'e'f']diisoquinoline-1,3,8,10-tetrone, 2,9-Dibenzyl-5,6,12,13-tetrachloro-anthra(2,1,9-def:6,5,10-d'e'f')diisoquinoline-1,3,8,10-tetrone, 2,9-Dipropyl-anthra[2,1,9-def: 6,5,10-d'e'f']diisoquinoline-1,3,8,10-tetrone, 2,9-Dimethyl-anthra[2,1,9-def:6,5,10-d'e'f']diisoquinoline-1,3,8,10-tetrone, 2,9-Dibenzyl-5,6,12,13-tetrachloro-anthra(2,1,9-def:6,5,10-d'e'f') diisoquinoline-1,3,8,10-tetrone, Phthalocyanine lead complex, Titanium(IV) oxide phthalocyanine, 2% dispersion with 2% BM5 (Polyvinylbutyral) binding agent in 96% 1,3-dioxolane, 1-(4-Dimethylaminophenyl)-3-(4-dimethylimmoniumcyclohexa-2,5-dien-1-ylidene)-2-oxocyclobuten-4-olate, Indium (III) phthalocyanine chloride, 1-(2,5-Dimethyl-pyrrol-3-yl)-3-(2,5-dimethyl-pyrrolium-3-ylidene)-cyclobuten-2-one-4-olate, 1-(1-Benzyl-quinolin-4-ylidenemethyl)-3-(1-benzyl-quinolinium-4-yl-methylene)-2-oxo-cyclobutene-4-olate, 5,10,15,20-Tetraphenylporphine (metal free), 1-(4-Dimethylamino-2-hydroxy-phenyl)-3-(4-dimethylimmonium-2-hydroxy-cyclohexa-2,5-dien-1-ylidene)-2-oxo-cyclobuten-4-olate, Bisbenzimidazo[2,1-a:2',1'-a']anthra[2,1,9-def:6,5,10-d'e'f']diisoquinoline-10,21-dione (Mixture with cis-isomer), Titanium(IV) oxide phthalocyanine, 5,10,15,20-Tetraphenylporphine cobalt (II), 1-(3,5-Dimethyl-4-ethyl-pyrrol-2-yl)-3-(3,5-dimethyl-4-ethyl-pyrrolium-2-ylidene)-cyclobuten-2-one-4-olate, Bisimidazo[2,1-a:2',1']anthra[2,1,9-def:6,5,10-d'e'f']diisoquinoline-dione (mixture with cis-isomer), 2,9-Di(2-methoxyethyl)-anthra[2,1,9-def-6,5,10 d',e',f']diisoquinoline-1,3,8,10-tetrone, Iron (III) chloride tetraphenylporphine, Azulenylium, dihydro-3-[2-hydroxy-3-(5-isopropyl-3,8-dimethyl-1.azulenyl)-4-oxo-2-cyclobuten-1-ylidene]-7-isopropyl-1,4-dimethyl, hydroxide and the like.

The organic matrix may be organic photoconductor (OPC) material which comprises a charge transport material (CTM). In an embodiment, the organic matrix may be a charge transport material (CTM) only. In another embodiment, the organic matrix may be a mixture of a charge generation material (CGM) and a charge transport material (CTM).

The charge generation material (CGM) may be electrical contact with the charge transport material (CTM) in the organic matrix.

The charge transport material may include, but are not limited to, 4,4'-TPD (Triphenylamine Dimer), 9-Dicyanomethylene-2,4,7-trinitrofluorene, N,N'-Di(naphthalene-1-yl)-N,N'-di(4-methyl-phenyl)-benzidine, N,N'-Di(naphthalene-2-yl)-N,N'-di(3-methyl-phenyl)-benzidine, 4,4'-(1,2-Ethanediylidene)-bis(2,6-dimethyl-2,5-cyclohexadien-1-one), 2-(1,1-Dimethylethyl)-4-[3-(1,1-dimethylethyl)-5-methyl-4-oxo-2,5-cyclohexa-dien-1-ylidene]-6-methyl-2,5-cyclohexadien-1-one, N,N'-Di(naphthalen-1-yl)-N,N'-di(3-methyl-phenyl)-benzidine, Poly(3-octylthiophene-2,5-diyl), Poly(3-decylthiophene-2,5-diyl), N-Biphenylyl-N-phenyl-N-(3-methylphenyl)-amine, 4-N,N-Bis(4-methylphenyl)-amino-benzaldehyde-N,N-diphenylhydrazone, p-Diphenylaminobenzaldehyde-N-phenyl-methyl-hydrazone, N,N'-diphenyl-N,N'-bis(3-hydroxyphenyl)-1,1'-biphenyl-4,4'-diamine, N,N'-diphenyl-N,N-bis(3-methylphenyl)-1,1'-biphenyl-4,4'-diamine, N,N,N',N'-tetra(4-methylphenyl)-(1,1'-biphenyl)-4,4'-diamine, 4,4'-(3,4-dimethylphenylazanediyl)bis(4,1-phenylene)dimethanol, N,N'-bis(3-methylphenyl)-N,N'-bis(4-n-butylphenyl)-1,1'-terphenyl-4,4-diamine. These charge transport material may be used alone or in a combination of two or more kinds thereof.

The weight ratio of CGM to CTM may be about 1:99 to about 95:5, e.g., about 10:90 to about 80:20. Within the range, the layer may provide the radiation image detector with good resolution and low noise. In an implementation, the weight ratio of CGM to CTM may be about 30:70 to about 70:30.

The volume percentage of the scintillating particles in the organic matrix may be about 10 vol % to about 95 vol %, e.g., about 15 vol % to about 80 vol %. Within the range, the composition may provide the radiation image detector with good resolution and low noise. For example, the volume percentage of the scintillating particles in the organic matrix may be about 20 vol % to about 65 vol %.

Another embodiment is directed to a method for preparing a composition for radiation image detector. The method comprises coating a charge generation material (CGM) onto a surface of scintillating particles; and dispersing the scintillating particles coated with the charge generation material into a organic matrix comprising a charge transport material (CTM).

In another embodiment, the method comprises mixing a charge generation material (CGM) and a charge transport material (CTM) to prepare a organic matrix; and dispersing scintillating particles into the organic matrix.

A binder resin can be added into the organic matrix. Examples of the binder resin may include, but are not limited to, styrene-based resin, polyolefin, acryl-based resin, vinyl acetate resin, epoxy resin, polyurethane resin, phenol resin, polyester resin, alkyd resin, polycarbonate resin, silicone resin, melamine resin, and the like.

The binder resin may be dissolved by a solvent such as aromatic solvent, alcohol, methylene chloride, 1,2-dichloroethane, methyl ethyl ketone, cyclohexane, ethyl acetate, butyl acetate, methyl cellosolve, ethyl cellosolve, tetrahydrofuran, 1,4-dioxane, pyridine, diethyl amine, and the like.

For dispersing the scintillating particles in the organic matrix, an ultrasonic dispersing apparatus, a ball mill, a sand grinder and a homomixer may be usable.

Another embodiment is directed to a radiation imaging detector comprising the foregoing composition.

The radiation may be at least one selected from said group consisting of X-ray, gamma-ray, and ionization radiation. The ionization radiation may include all radiation that penetrates material and produces light in scintillation material. For example, the ionization radiation may include alpha-ray, beta-ray, neutron and the like.

The organic matrix may be in the form of a layer. The scintillating particles coated with the charge generation material (CGM) may be dispersed in the layer of the organic matrix. The layer may have a thickness of about 5 µm to about 2000 µm, e.g., about 10 µm to about 1000 µm.

The layer of the organic matrix having the scintillating particles dispersed therein can be used for a radiation imaging detector. The layer may be deposited on top of an image charge collection device.

Upon the absorption of radiation by the scintillating particles, the scintillating light generated may be absorbed by the immediately adjacent CGM material and may be converted locally to electrical charges. Under a bias applied electrical field, these charges are separated and transported by the CTM material in the matrix to a top and bottom interface and collected by a pixel electrode of a imaging system such as a thin film transistor (TFT) array.

The scintillation decay time and afterglow properties can also be chosen to match the requirement of an imaging system, such as imaging frame rate, image integration time and so forth. In an embodiment, the light absorption coefficient of a phthalocyanine based CGM material may match the scintillating spectrum of Europium doped GOS. Scintillating light may be absorbed by the surrounding CGM material in a very short distance (such as 0.01-10 microns). CGM may generate electrical charges immediately adjacent to the scintillating particle where the radiation is absorbed.

A scintillating light of conventional scintillation imaging detectors needs to travel a long distance of typically hundreds of microns before reaching the light to electrical charge means of photo diodes. Along this long optical path, the scintillation light of conventional scintillation imaging detectors may undergo many scattering inside the scintillation material and resulted with image sharpness degradation.

On the other hand, the composition of the present invention may convert the scintillating light to electrical charges locally before the light is substantial scattered. The electrical charges are then directed by the electrical field in the CTM material to the respective image charge electrode and therefore high spatial image resolution can be retained. The image qualities obtained from the radiation imaging detector of the present invention may be comparable to those produced from direct conversion semiconductor such as selenium. In addition to the high image spatial quality, the radiation absorption efficiency of the composition of the present invention may be selectable from a wide range of scintillating material with different atomic number and particle sizes.

The composition of the present invention may be coated onto a charge readout system such as thin film transistor (TFT) to form a layer for a radiation converter similar to the TFT array described in U.S. Pat. No. 5,319,206, issued to Lee et al. on Jun. 7, 1994, which is incorporated by reference herein in its entirety. An upper electrode may be then deposited on the layer for a radiation converter. A bias voltage may be applied between the upper electrode and the TFT current return plane producing a uniform electric field in the layer for a radiation converter. During imaging, impinging radiation that has passed through an object such as a human body may be absorbed by the composition in the layer for a radiation converter, producing light with intensity proportional to the intensity of the absorbed radiation energy. The majority of this scintillating light will be absorbed by the surrounding CGM and in turn may generate charges of electron-hole pairs proportional to the intensity of the scintillation. Under the electric field produced by the bias electrode, one polarity of charges will be driven to a charge collector in the TFT and the opposite polarity of charges will be driven to a bias electrode. This structure may be similar to a direct conversion radiation imaging detector such as selenium detector described U.S. Pat. No. 5,319,206 with the charge conversion selenium layer. Since the majority of lights may be absorbed by the CGM coating or immediately adjacent to the scintillating material, charges generated by absorption of radiation in this process may be very local to the radiation absorption material. With the bias electric field, these charges may be driven directly to the charge collecting pixel immediately below the point of radiation interaction with a spreading no larger than the size of the scintillation particles which can be much smaller than the TFT pixel size. Unlike the indirect conversion detector using just GOS or cesium iodide scintillating material, very little scintillating light may be spread beyond the radiation interaction point and therefore the spatial resolution may be retained similar to the direct conversion detector such as selenium on TFT.

Figure 3:
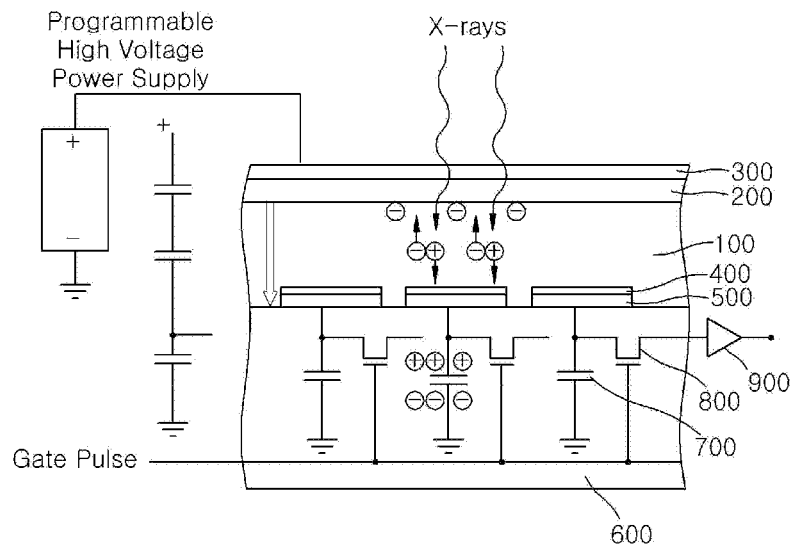
FIG. 3 is a schematic view illustrating a cross-sectional view of a radiation imaging detector according to an exemplary embodiment.

FIG. 3 is a schematic view illustrating a cross-sectional view of a radiation imaging detector according to an exemplary embodiment.

The radiation imaging detector can be prepared beginning with a commercially available thin film transistor panel which comprises a substrate 600, signal storage capacitors 700 transistors 800 and charge amplifier 900. Commercially available panels used in liquid crystal displays may be a convenient starting point for building the thin film transistor panel. A charge collection electrode 500 may be formed on the thin film transistor panel. Over the surface of the charge collection electrode 500 there may be applied an electron blocking layer 400. The electron blocking layer 400 may be preferably provided by an aluminum oxide. The layer for a radiation converter 100 comprising the composition of the present invention may be coated over the electron blocking layer 400. The charge injection blocking layer 200 and top electrode 300 may be formed on the layer for a radiation converter 100.

The composition of the present invention can be applicable not only to the radiation imaging system for medical diagnosis, but also to other types of radiation imaging systems for industrial use, nondestructive inspection, autoradiography and the like.

In an implementation, electrostatic charges may also be deposited on to the composition of the present invention without the top electrode using a charging device such as a corona charger. The electrostatic charges may be discharged by radiation such as X-ray, gamma-ray, and ionization radiation. Upon exposure of x-ray or ionization radiation, the surface electrostatic charges may be discharged according to the intensity of the radiation. The remaining charges on the surface of the composition may be proportional the inverted image of the radiation. The electrostatic charges may be recorded to form a radiation image. The image of the radiation can be obtained by scanning the surface with an electrostatic probe, charged toner particles, or any two dimensional charge image sensing devices.

Details of the present disclosure will be explained in more detail with reference to the following examples and preparative examples. Embodiments that are not included herein will be readily recognized and appreciated by those skilled in the art, and an explanation thereof is omitted.

EXAMPLES

Figure 4:
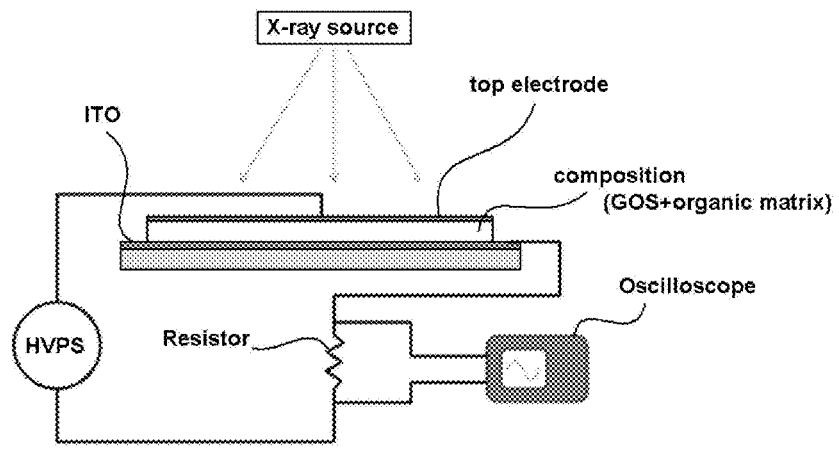
FIG. 4 is a schematic of an experimental setup used in Example.

Methylene chloride and toluene are mixed with 10:1 weight ratio to prepare a solution. Then, 2% weight of oxytitanium phthalocyanine having the chemical formula 1 as CGM, 2% weight of 4,4'-TPD (Triphenylamine Dimer) having the chemical formula 2 as CTM, 2% weight of Polycarbonate polymer are added to the solution to obtain a mixture. The weight ratio of CGM, CTM and Polycarbonate is 1:1:1. 20 g of Europium doped GOS powder having a diameter of 4 μm is added to 4 ml of CGM/CTM mixture plus 0.54 ml of toluene to prepare a composition. The composition is then coated onto an indium tin oxide (ITO) bottom electrode using a doctor blade with a thickness of 500 μm. After 4 hours of curing at a temperature of 50° C., a conductive top elect ode is coated to the top surface of the composition. A bias voltage is applied to the top electrode of the sample and the ITO bottom electrode is connected to a load resistor R with return circuit to the high voltage power supply. An oscilloscope probe is connected across the load resistor R as shown in FIG. 4.

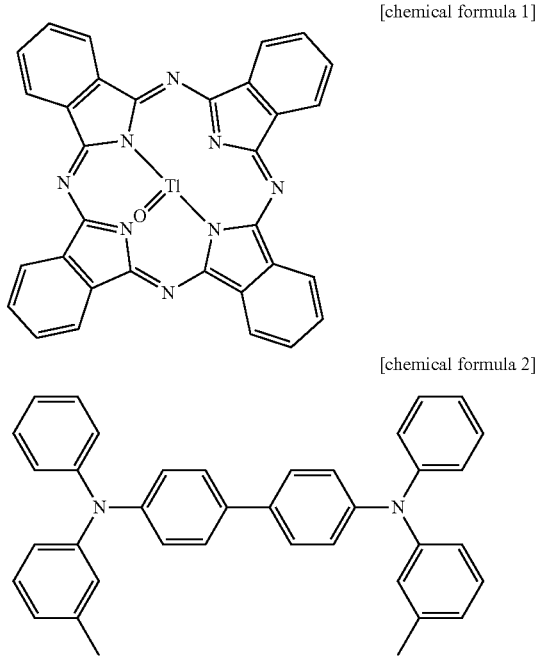

[chemical formula 1]

[chemical formula 2]

Figure 5:
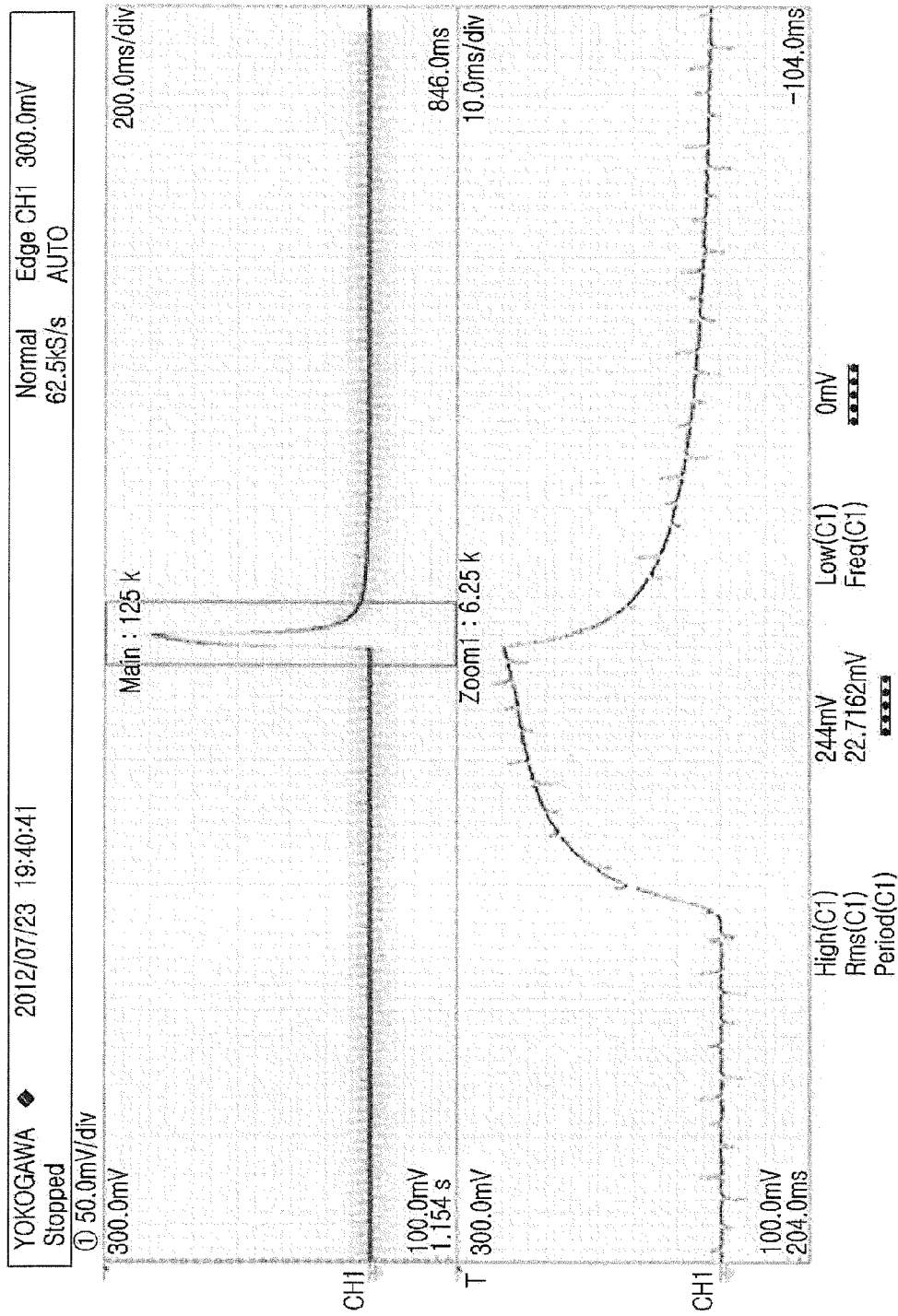
FIG. 5 is an oscilloscope signal when 1,000 volts of positive bias is applied in Example.
Figure 6:
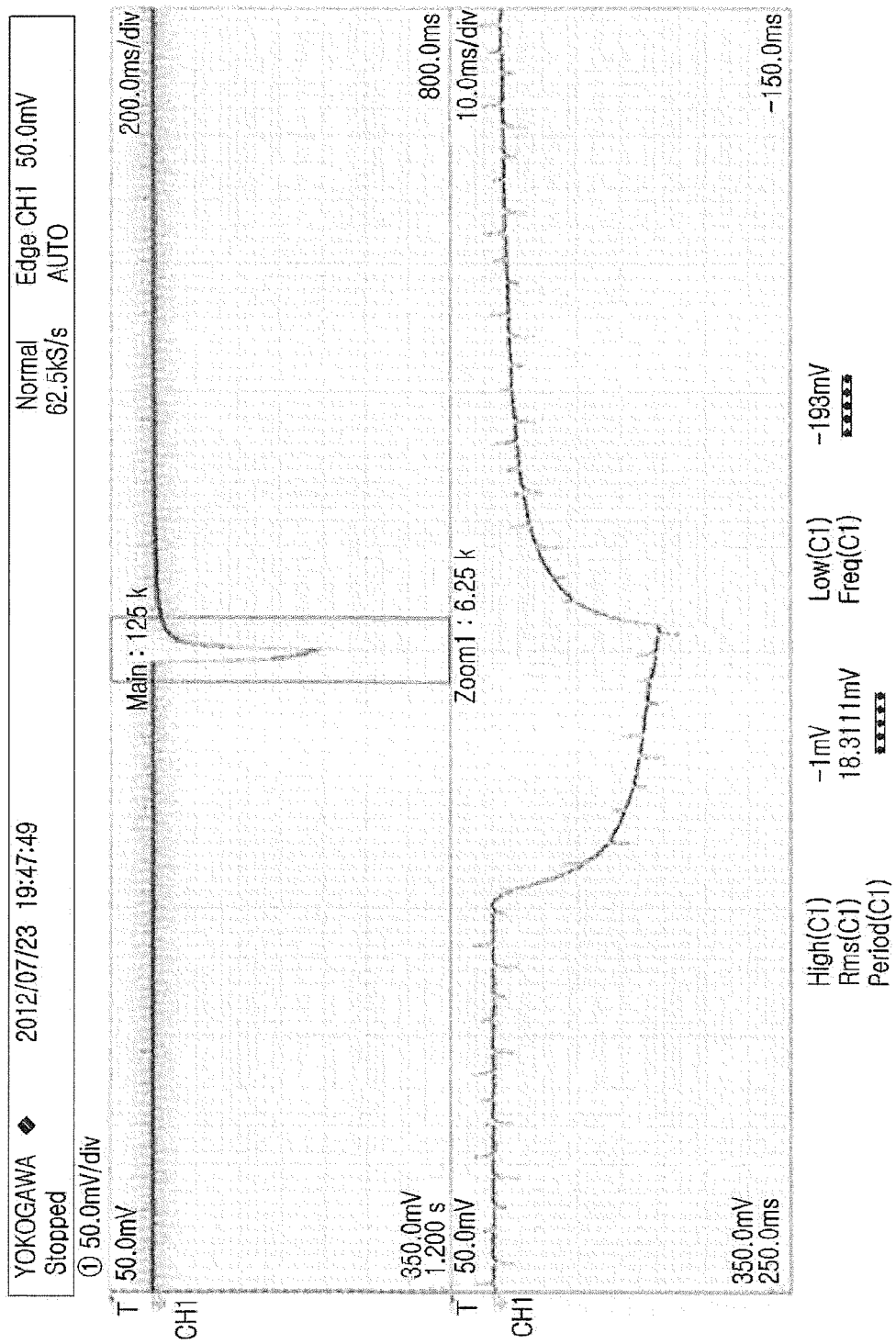
FIG. 6 is an oscilloscope signal when 1,000 volts of negative bias is applied in Example.

Upon exposure of x-ray from a source of 70 KVP, 100 mA, and 20 milliseconds, an oscilloscope signal is shown in FIG. 5 when 1,000 volts of positive bias is applied. FIG. 6 shows the oscilloscope signal when 1,000 volts of negative bias is applied. When a two dimensional thin film transistor (TFT) array is used in place of the ITO glass, the charge signal produced by the x-ray exposure will be collected by each individual pixel element and an x-ray image will be formed.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A composition for a radiation image detector, comprising:
    an organic matrix comprising a charge transport material (CTM); and
    scintillating particles for absorbing radiation and emitting light in response thereto, being dispersed in the organic matrix,
    wherein each of the scintillating particles is surrounded by and in contact with a respective layer of charge generation material (CGM), and
    wherein the charge generation material (CGM) is configured to generate charge in response to absorbing the light emitted by the scintillating particles.

2. The composition for a radiation image detector as claimed in claim 1, wherein the charge generation material (CGM) in contact with the scintillating particles is present in the form of a mixture with the charge transport material (CTM) in the organic matrix.

3. The composition for a radiation image detector as claimed in claim 1, wherein the scintillating particles are coated with the charge generation material (CGM) in part or in whole.

4. The composition for a radiation image detector as claimed in claim 3, wherein the thickness of the charge generation material coating the scintillating particles is sufficient to absorb more than about 20% of the scintillating light emitted from the scintillating particles.

5. The composition for a radiation image detector as claimed in claim 1, wherein the scintillating particles include at least one of Gadolinium Oxysulfide (GOS), Cesium Iodide (CsI), Sodium Iodide (NaI), bismuth germanate (BGO), Zinc Sulfide (ZnS), Cadmium tungstate ($CdWO_4$ or CWO), LYSO ($Lu_{1.8}Y_{0.2}SiO_5(Ce)$).

6. The composition for a radiation image detector as claimed in claim 1, wherein the scintillating particles are doped with dopant including at least one of Europium, terbium (Tb), Praseodymium (Pr) and Lithium (Li).

7. The composition for a radiation image detector as claimed in claim 6, wherein the emission spectrum of the doped scintillating particles is in the range of the absorption spectrum of the CGM material.

8. The composition for a radiation image detector as claimed in claim 1, wherein the charge generation material is at least one of quinolines, porphyrins, quinacridones, dibromo anthanthrone pigments, squalilium dyes, perylene diamines, perinone diamines, polynuclear aromatic quinones, pyrylium salts, thiopyrylium salts, azo pigments, triphenylmethane type dyes, selenium, oxyvanadium phthalocyanine, chloroaluminum phthalocyanine, copper phthalocyanine, oxytitanium phthalocyanine, chlorogallium phthalocyanine, hydroxygallium phthalocyanine, magnesium phthalocyanine, metal-free phthalocyanine, indigo type pigments, and combinations thereof.

9. The composition for a radiation image detector as claimed in claim 1, wherein the charge transport material is at least one of 4,4'-TPD (Triphenylamine Dimer), 9-Dicyanomethylene-2,4,7-trinitrofluorene, N,N'-Di(naphthalene-1-yl)-N,N'-di(4-methyl-phenyl)-benzidine, N,N'-Di(naphthalene-2-yl)-N,N'-di(3-methyl-phenyl)-benzidine, 4,4'-(1,2-Ethanediylidene)-bis(2,6-dimethyl-2,5-cyclohexadien-1-one), 2-(1,1-Dimethylethyl)-4-[3-(1,1-dimethylethyl)-5-methyl-4-oxo-2,5-cyclohexa-dien-1-ylidene]-6-methyl-2,5-cyclohexadien-1-one, N,N'-Di(naphthalen-1-yl)-N,N'-di(3- methyl-phenyl)-benzidine, Poly(3-octylthiophene-2,5-diyl), Poly(3-decylthiophene-2,5-diyl), N-Biphenylyl-N-phenyl-N-(3-methylphenyl)-amine, 4-N,N-Bis(4-methylphenyl)-amino-benzaldehyde-N,N-diphenylhydrazone, p-Diphenylaminobenzaldehyde-N-phenyl-methyl-hydrazone, N,N'-diphenyl-N,N'-bis(3-hydroxyphenyl)-1,1'-biphenyl-4,4'-diamine, N,N'-diphenyl-N,N'-bis(3-methylphenyl)-1,1'-biphenyl-4,4'-diamine, N,N,N'N'-tetra(4-methylphenyl)-(1,1'-biphenyl)-4,4'-diamine, 4,4'-(3,4-dimethylphenylazanediyl)bis(4,1-phenylene)dimethanol, N,N'-bis(3-methylphenyl)-N,N'-bis(4-n-butylphenyl)-1,1'-terphenyl-4,4-diamine, and combinations thereof.

10. The composition for a radiation image detector as claimed in claim 1, wherein the weight ratio of CGM to CTM is about 1:99 to about 95:5.

11. The composition for a radiation image detector as claimed in claim 1, wherein the average diameter of the scintillating particles is in the range of about 1 to about 100 µm.

12. The composition for a radiation image detector as claimed in claim 1, wherein the volume percentage of the scintillating particles in the composition is about 10 vol % to about 95 vol %.

13. The composition for a radiation image detector as claimed in claim 1, wherein the radiation is at least one selected from group consisting of X-ray, gamma-ray, and ionizing radiation.

14. The composition for a radiation image detector as claimed in claim 1, wherein the composition is in the form of a layer having a thickness of about 5 µm to about 2000 µm.

15. The composition for a radiation image detector as claimed in claim 14, wherein the layer is deposited on top of an image charge collection device.

16. A radiation imaging detector comprising the composition of claim 15.

17. The radiation imaging detector as claimed in claim 16, wherein the size of the scintillating particles is smaller than a pixel size of the radiation imaging detector.

18. The radiation imaging detector as claimed in claim 16, wherein the composition is charged with electrostatic charges.

19. The radiation imaging detector as claimed in claim 18, wherein the electrostatic charges are discharged by radiation selected from group consisting of X-ray, gamma-ray, and ionizing radiation.

20. The radiation imaging detector as claimed in claim 18, wherein the electrostatic charges are recorded to form a radiation image.

21. A method for preparing a composition for a radiation image detector, comprising:
    coating a charge generation material (CGM) onto a surface of scintillating particles; and
    dispersing the scintillating particles coated with the charge generation material into an organic matrix comprising a charge transport material (CTM), wherein the scintillating particles absorb radiation and emit light in response thereto;
    wherein each of the scintillating particles is surrounded by and in contact with a respective a layer of the charge generation material (CGM), and
    wherein the charge generation material (CGM) is configured to generate charge in response to absorbing the light emitted by the scintillating particles.

22. A method for preparing a composition for a radiation image detector, comprising:
    mixing a charge generation material (CGM) and a charge transport material (CTM) to prepare an organic matrix; and
    dispersing scintillating particles into the organic matrix, wherein the scintillating particles absorb radiation and emit light in response thereto;
    wherein each of the scintillating particles is surrounded by and in contact with a respective a layer of the charge generation material (CGM), and
    wherein the charge generation material (CUM) is configured to generate charge in a response to absorbing the light emitted by the scintillating particles.

* * * * *